United States Patent
Lee et al.

(10) Patent No.: US 10,622,546 B2
(45) Date of Patent: Apr. 14, 2020

(54) MAGNETIC MEMORY DEVICE AND METHOD FOR FABRICATING THE SAME

(71) Applicant: Samsung Electronics Co., Ltd., Suwon-si, Gyeonggi-do (KR)

(72) Inventors: Sung Chul Lee, Osan-si (KR); Se Chung Oh, Yongin-si (KR); Sangjun Yun, Hwaseong-si (KR); Jae Hoon Kim, Seoul (KR); KyungTae Nam, Suwon-si (KR); Eunsun Noh, Yongin-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 16/028,688

(22) Filed: Jul. 6, 2018

(65) Prior Publication Data

US 2019/0189906 A1    Jun. 20, 2019

(30) Foreign Application Priority Data

Dec. 19, 2017    (KR) .................. 10-2017-0174894

(51) Int. Cl.
| | |
|---|---|
| *H01L 43/02* | (2006.01) |
| *H01L 43/12* | (2006.01) |
| *H01L 43/10* | (2006.01) |
| *G11C 11/16* | (2006.01) |
| *H01L 27/22* | (2006.01) |
| *H01L 43/08* | (2006.01) |

(52) U.S. Cl.
CPC ............ *H01L 43/02* (2013.01); *G11C 11/161* (2013.01); *H01L 27/222* (2013.01); *H01L 43/08* (2013.01); *H01L 43/10* (2013.01); *H01L 43/12* (2013.01)

(58) Field of Classification Search
CPC ......... H01L 43/02; H01L 43/10; H01L 43/12; H01L 27/222; G11C 11/161
See application file for complete search history.

(56) References Cited

U.S. PATENT DOCUMENTS

| | | | |
|---|---|---|---|
| 7,064,934 B2 | 6/2006 | Mao et al. | |
| 7,190,557 B2 | 3/2007 | Li et al. | |
| 8,120,126 B2 | 2/2012 | Lee et al. | |
| 8,854,876 B2 | 10/2014 | Uchida et al. | |
| 8,878,318 B2 | 11/2014 | Chen et al. | |
| 9,153,306 B2 | 10/2015 | Ohno et al. | |
| 9,184,376 B2 | 11/2015 | Park et al. | |
| 9,275,669 B1 | 3/2016 | Girgis et al. | |
| 9,276,201 B2 | 3/2016 | Pi et al. | |
| 9,905,753 B2 | 2/2018 | Lee et al. | |
| 2006/0227465 A1* | 10/2006 | Inokuchi | B82Y 25/00 360/324.1 |
| 2008/0191251 A1* | 8/2008 | Ranjan | B82Y 10/00 257/295 |
| 2014/0175581 A1 | 6/2014 | Guo | |
| 2015/0076485 A1* | 3/2015 | Sandhu | G11C 11/161 257/43 |

* cited by examiner

*Primary Examiner* — Yosef Gebreyesus
(74) *Attorney, Agent, or Firm* — Lee IP Law, P.C.

(57) ABSTRACT

A magnetic memory device includes a substrate, a tunnel barrier pattern on the substrate, a first magnetic pattern and a second magnetic pattern spaced apart from each other with the tunnel barrier pattern therebetween, and a short preventing pattern spaced apart from the tunnel barrier pattern with the second magnetic pattern therebetween. The short preventing pattern includes at least two oxide layers and at least two metal layers, which are alternately stacked.

15 Claims, 13 Drawing Sheets

MAGNETIC MEMORY DEVICE AND METHOD FOR FABRICATING THE SAME

CROSS-REFERENCE TO RELATED APPLICATION

Korean Patent Application No. 10-2017-0174894, filed on Dec. 19, 2017, in the Korean Intellectual Property Office, and entitled: "Magnetic Memory Device and Method for Fabricating the Same," is incorporated by reference herein in its entirety.

BACKGROUND

1. Field

Embodiments relate to a magnetic memory device and a method for fabricating the same.

2. Description of the Related Art

As high-speed and/or low power consumption electronic devices have been demanded, high-speed and/or low-voltage semiconductor memory devices used therein have also been demanded. Magnetic memory devices have been developed as semiconductor memory devices capable of satisfying these demands. The magnetic memory devices may emerge as next-generation semiconductor memory devices because of their high-speed and/or non-volatile characteristics.

In general, a magnetic memory device may include a magnetic tunnel junction (MTJ) pattern. The magnetic tunnel junction pattern may include two magnetic layers and an insulating layer between the two magnetic layers. A resistance value of the magnetic tunnel junction pattern may be changed depending on magnetization directions of the two magnetic layers. For example, when the magnetization directions of the two magnetic layers are anti-parallel to each other, the magnetic tunnel junction pattern may have a relatively high resistance value. When the magnetization directions of the two magnetic layers are parallel to each other, the magnetic tunnel junction pattern may have a relatively low resistance value. The magnetic memory device may read/write data using a difference between the resistance values of the magnetic tunnel junction pattern.

SUMMARY

In an aspect, a magnetic memory device may include a substrate, a tunnel barrier pattern on the substrate, a first magnetic pattern and a second magnetic pattern spaced apart from each other with the tunnel barrier pattern therebetween, and a short preventing pattern spaced apart from the tunnel barrier pattern with the second magnetic pattern therebetween. The short preventing pattern may include at least two oxide layers and at least two metal layers, which are alternately stacked.

In an aspect, a magnetic memory device may include a substrate, a tunnel barrier pattern on the substrate, a first magnetic pattern and a second magnetic pattern spaced apart from each other with the tunnel barrier pattern therebetween, and a short preventing pattern spaced apart from the tunnel barrier pattern with the second magnetic pattern therebetween. The short preventing pattern may include an oxide layer, and oxygen atoms in the oxide layer may have a concentration gradient in a direction perpendicular to a top surface of the substrate.

In an aspect, a method for fabricating a magnetic memory device may include preparing a substrate, sequentially forming a first magnetic layer, a tunnel barrier layer and a second magnetic layer on the substrate, forming a short preventing layer on the second magnetic layer, and etching the short preventing layer, the second magnetic layer, the tunnel barrier layer, and the first magnetic layer. The short preventing layer may include at least two oxide layers and at least two metal layers, which are alternately stacked.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
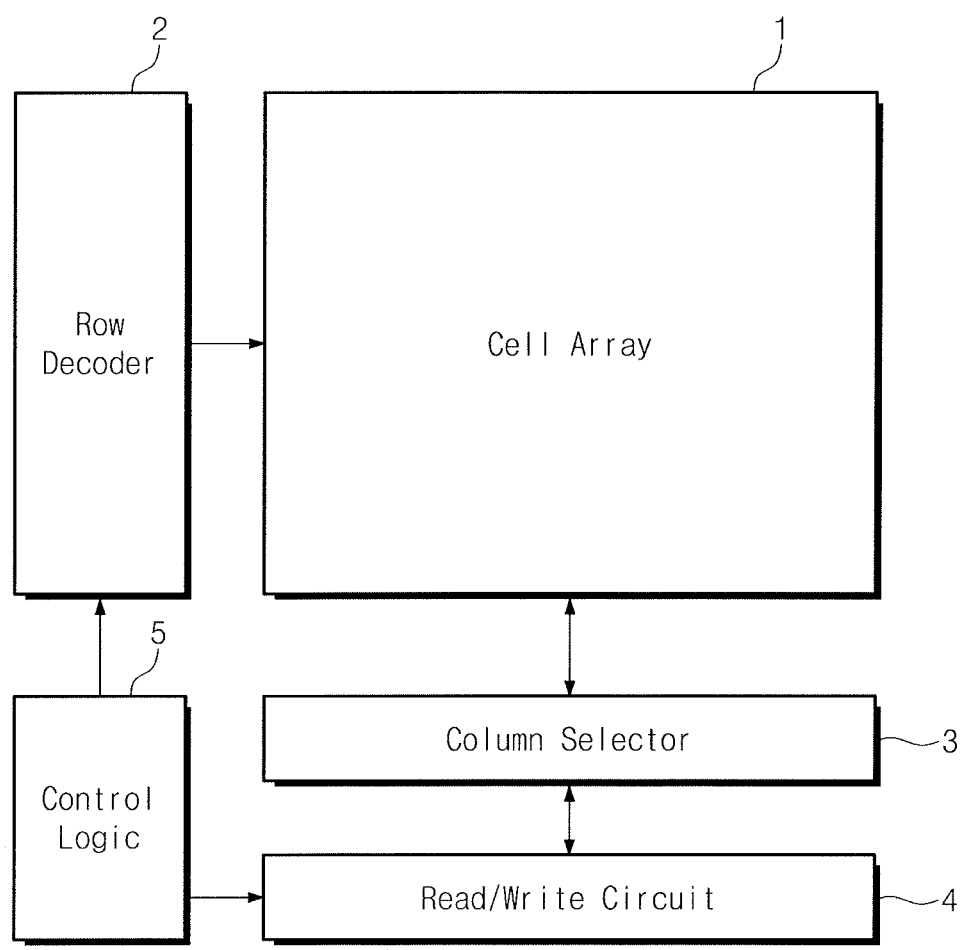
FIG. 1 illustrates a schematic block diagram of a magnetic memory device according to some embodiments.

FIG. 1 is a schematic block diagram illustrating a magnetic memory device according to some embodiments. Referring to FIG. 1, a magnetic memory device may include a memory cell array 1, a row decoder 2, a column selector 3, a read/write circuit 4, and a control logic 5.

The memory cell array 1 may include a plurality of word lines, a plurality of bit lines, and memory cells connected to crossing points of the word lines and the bit lines. The memory cell array 1 will be described later in more detail with reference to FIG. 2.

The row decoder 2 may be connected to the memory cell array 1 through the word lines. The row decoder 2 may decode an address signal input from an external system to select one among the word lines.

The column selector 3 may be connected to the memory cell array 1 through the bit lines and may decode an address signal input from the external system to select one among the bit lines. The selected bit line may be connected to the read/write circuit 4 through the column selector 3.

The read/write circuit 4 may provide a bit line bias for accessing a selected memory cell in response to a control signal of the control logic 5. The read/write circuit 4 may provide a bit line voltage to the selected bit line to write/read data into/from the selected memory cell.

The control logic 5 may output control signals for controlling the magnetic memory device, in response to command signals provided from the external system. The control signals output from the control logic 5 may control the read/write circuit 4.

Figure 2:
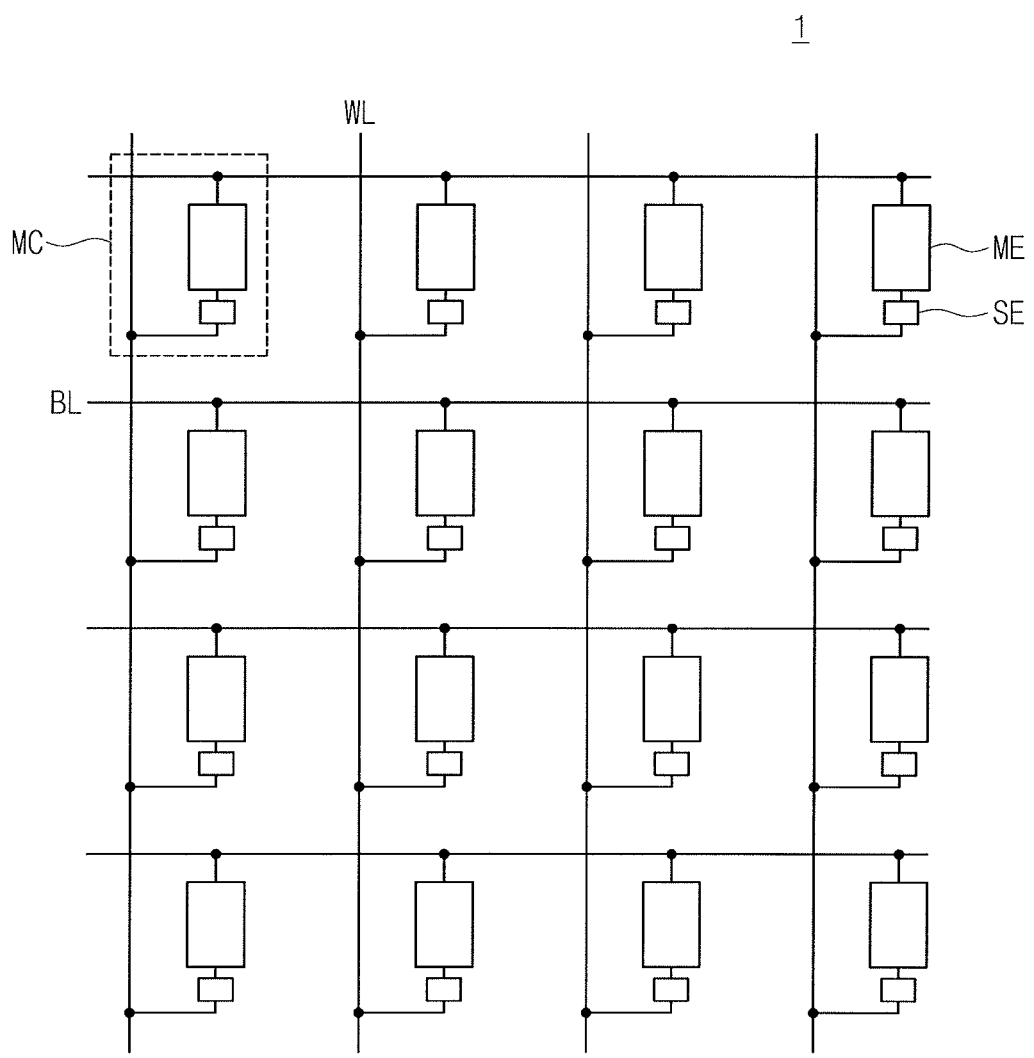
FIG. 2 illustrates a circuit diagram of a memory cell array of a magnetic memory device according to some embodiments.
Figure 3:
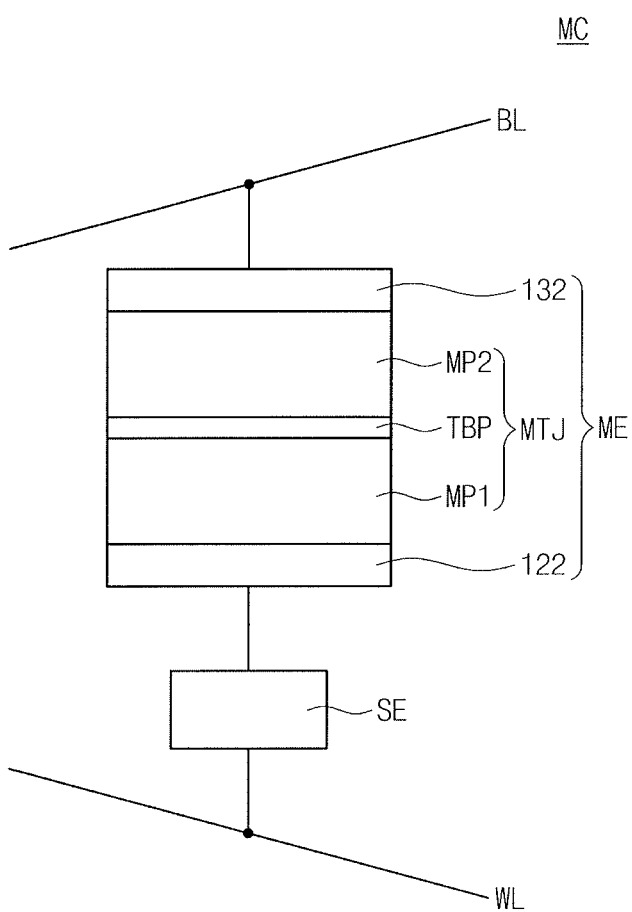
FIG. 3 illustrates a circuit diagram of a memory cell of a magnetic memory device according to some embodiments.

FIG. 2 is a circuit diagram illustrating a memory cell array of a magnetic memory device according to some embodiments. FIG. 3 is a circuit diagram illustrating a memory cell of a magnetic memory device according to some embodiments.

Referring to FIG. 2, the memory cell array 1 may include a plurality of first conductive lines, a plurality of second conductive lines, and memory cells MC. The first conductive lines may be word lines WL, and the second conductive lines may be bit lines BL. The memory cells MC may be two-dimensionally or three-dimensionally arranged. Each of the memory cells MC may be connected between a corresponding one of the word lines WL and a corresponding one of the bit lines BL. Each of the word lines WL may be connected to a plurality of the memory cells MC. The bit lines BL may be respectively connected to the memory cells MC connected to each of the word lines WL. Thus, the memory cells MC connected to each of the word lines WL may be connected to the read/write circuit 4 of FIG. 1 through the bit lines BL, respectively.

Referring to FIG. 3, each of the memory cells MC may include a memory element ME and a selection element SE. The memory element ME may be connected between the bit line BL and the selection element SE, and the selection element SE may be connected between the memory element ME and the word line WL. The memory element ME may be a variable resistance element of which a resistance state is switchable between two different resistance states by an electrical pulse applied thereto.

In some embodiments, the memory element ME may have a thin layer structure of which an electrical resistance is changeable using spin transfer torque of electrons of a program current passing therethrough. The memory element ME may have a thin layer structure showing a magnetoresistance characteristic and may include at least one ferromagnetic material and/or at least one anti-ferromagnetic material.

In some embodiments, the memory element ME may include a first magnetic pattern MP1, a second magnetic pattern MP2, and a tunnel barrier pattern TBP between the first and second magnetic patterns MS1 and MS2. The first magnetic pattern MP1, the second magnetic pattern MP2 and the tunnel barrier pattern TBP may constitute a magnetic tunnel junction pattern MTJ. Each of the first and second magnetic patterns MP1 and MP2 may include at least one magnetic layer formed of a magnetic material. The memory element ME may further include a first electrode pattern 122 between the first magnetic pattern MP1 and the selection element SE, and a second electrode pattern 132 between the second magnetic pattern MP2 and the bit line BL.

The selection element SE may selectively control a flow of charges passing through the memory element ME. For example, the selection element SE may be a diode, a PNP bipolar transistor, an NPN bipolar transistor, an NMOS field effect transistor, or a PMOS field effect transistor. When the selection element SE is a three-terminal element (e.g., the bipolar transistor or the MOS field effect transistor), an additional interconnection line may be connected to the selection element SE.

Figure 4:
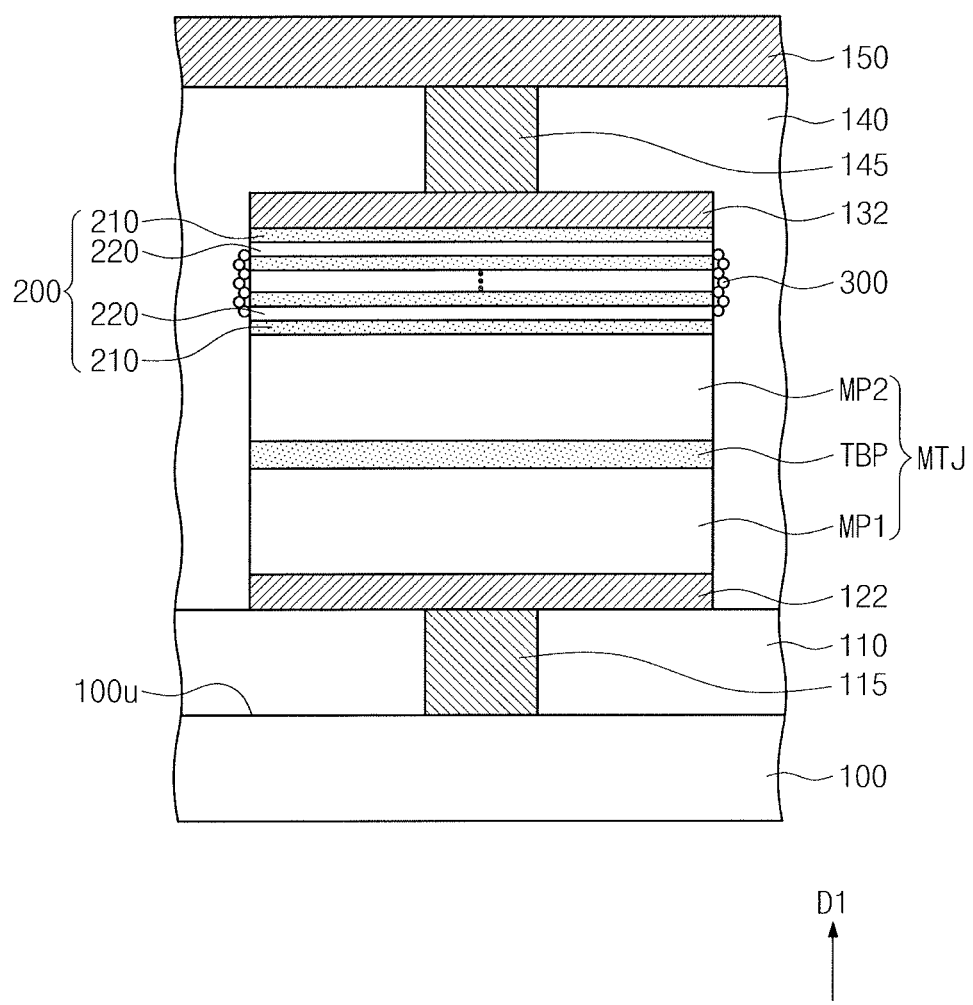
FIG. 4 illustrates a cross-sectional view of a magnetic memory device according to some embodiments.
Figure 5:
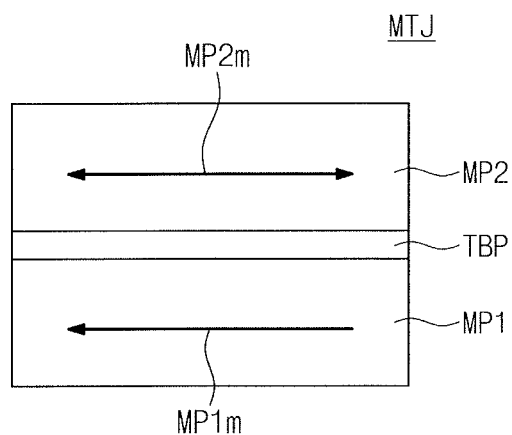
FIGS. 5 and 6 illustrate cross-sectional views of examples of a magnetic tunnel junction pattern of a magnetic memory device according to some embodiments.
Figure 6:
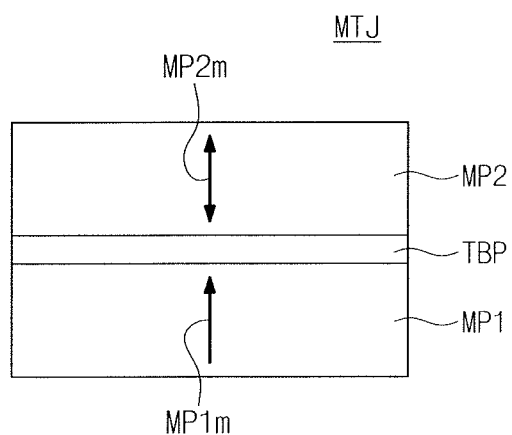

FIG. 4 is a cross-sectional view illustrating a magnetic memory device according to some embodiments. FIGS. 5 and 6 are cross-sectional views illustrating examples of a magnetic tunnel junction pattern of a magnetic memory device according to some embodiments.

Referring to FIG. 4, a substrate 100 may be provided. The substrate 100 may include a semiconductor material. For example, the substrate 100 may be a silicon substrate, a germanium substrate, or a silicon-germanium substrate. A selection element (not shown) may be provided on the substrate 100. In some embodiments, the selection element may include a diode, a PNP bipolar transistor, an NPN bipolar transistor, an NMOS field effect transistor, or a PMOS field effect transistor.

A first interlayer insulating layer 110 may be provided on the substrate 100. The first interlayer insulating layer 110 may include an insulating material. For example, the first interlayer insulating layer 110 may include silicon oxide, silicon nitride, silicon oxynitride, or any combination thereof.

A first contact plug 115 may be provided in the first interlayer insulating layer 110. The first contact plug 115 may penetrate the first interlayer insulating layer 110 so as to be connected to the substrate 100. For example, the first contact plug 115 may penetrate the first interlayer insulating layer 110 in a first direction D1 perpendicular to a top surface 100$u$ of the substrate 100 and may be electrically connected to one terminal of the selection element. The first contact plug 115 may include a conductive material. For example, the first contact plug 115 may include a doped semiconductor material (e.g., doped silicon), a metal (e.g., tungsten (M), aluminum (Al), copper (Cu), titanium (Ti), and/or tantalum (Ta)), a conductive metal nitride (e.g., titanium nitride, tantalum nitride, and/or tungsten nitride), a metal-semiconductor compound (e.g., a metal silicide), or any combination thereof.

A first electrode pattern 122 may be provided on the first interlayer insulating layer 110 and the first contact plug 115. The first electrode pattern 122 may be electrically connected to the selection element through the first contact plug 115. The first electrode pattern 122 may include a conductive material, e.g., a metal, a conductive metal nitride, and the like.

In some embodiments, the first electrode pattern 122 may include at least one seed layer used as a seed in a process of forming a first magnetic pattern MP1 to be described later. For example, when the first magnetic pattern MP1 is formed of a magnetic material having a $L1_0$ structure, the first electrode pattern 122 may include a seed layer including a conductive metal nitride having a sodium chloride (NaCl) crystal structure, e.g., titanium nitride, tantalum nitride, chromium nitride, vanadium nitride, and the like. For another example, when the first magnetic pattern MP1 has a hexagonal close packed (HCP) crystal structure, the first electrode pattern 122 may include a seed layer including a conductive material having the HCP crystal structure, e.g., titanium, ruthenium, and the like.

A magnetic tunnel junction pattern MTJ may be provided on the first electrode pattern 122. The magnetic tunnel junction pattern MTJ may include the first magnetic pattern MP1, a second magnetic pattern MP2, and a tunnel barrier pattern TBP between the first and second magnetic patterns MP1 and MP2. The first magnetic pattern MP1 may be between the first electrode pattern 122 and the tunnel barrier pattern TBP, and the second magnetic pattern MP2 may be between a second electrode pattern 132 and the tunnel barrier pattern TBP. For example, the tunnel barrier pattern TBP may include, e.g., a magnesium oxide (MgO) layer, a titanium oxide (TiO) layer, an aluminum oxide (AlO) layer, a magnesium-zinc oxide (MgZnO) layer, a magnesium-boron oxide (MgBO) layer, and the like. Each of the first and second magnetic patterns MP1 and MP2 may include at least one magnetic layer.

Referring to FIGS. 5 and 6, the first magnetic pattern MP1 may include a reference layer having a magnetization direction MP1m fixed in one direction and the second magnetic pattern MP2 may include a free layer having a magnetization direction MP2m changeable to be parallel or anti-parallel to the magnetization direction MP1m of the reference layer. FIGS. 5 and 6 illustrate the examples in which the first magnetic pattern MP1 includes the reference layer and the second magnetic pattern MP2 includes the free layer. Alternatively, the first magnetic pattern MP1 may include the free layer and the second magnetic pattern MP2 may include the reference layer.

In some embodiments, as illustrated in FIG. 5, the magnetization directions MP1m and MP2m may be substantially parallel to an interface between the tunnel barrier pattern TBP and the first magnetic pattern MP1. In this case, each of the reference layer and the free layer may include a ferromagnetic material. The reference layer may further include an anti-ferromagnetic material for fixing or pinning a magnetization direction of the ferromagnetic material.

In certain embodiments, as illustrated in FIG. 6, the magnetization directions MP1m and MP2m may be substantially perpendicular to the interface between the tunnel barrier pattern TBP and the first magnetic pattern MP1. In this case, each of the reference layer and the free layer may include at least one of a perpendicular magnetic material (e.g., CoFeTb, CoFeGd, or CoFeDy), a perpendicular magnetic material having a $L1_0$ structure, a CoPt alloy having a hexagonal close packed (HCP) lattice structure, or a perpendicular magnetic structure. The perpendicular magnetic material having the $L1_0$ structure may include at least one of FePt having the $L1_0$ structure, FePd having the $L1_0$ structure, CoPd having the $L1_0$ structure, or CoPt having the $L1_0$ structure. The perpendicular magnetic structure may include magnetic layers and non-magnetic layers, which are alternately and repeatedly stacked. For example, the perpendicular magnetic structure may include at least one of (Co/Pt)n, (CoFe/Pt)n, (CoFe/Pd)n, (Co/Pd)n, (Co/Ni)n, (CoNi/Pt)n, (CoCr/Pt)n, or (CoCr/Pd)n, where "n" denotes the number of bilayers. Here, the reference layer may be thicker than the free layer and/or a coercive force of the reference layer may be greater than a coercive force of the free layer.

Referring to FIG. 4, a short preventing pattern 200 may be provided on the second magnetic pattern MP2. The short preventing pattern 200 may include at least two oxide layers 210 and at least two metal layers 220, which are alternately stacked. In some embodiments, a lowermost one of the oxide layers 210 may be in contact, e.g., direct contact, with the second magnetic pattern MP2. In this case, each of the metal layers 220 may be between a pair of the oxide layers 210 adjacent directly to each other. In certain embodiments, a lowermost one of the metal layers 220 may be in contact with the second magnetic pattern MP2. In this case, each of the oxide layers 210 may be between a pair of the metal layers 220 adjacent directly to each other. The short preventing pattern 200 may inhibit or prevent conductive particles from being re-deposited on sidewalls of the first and second magnetic patterns MP1 and MP2, and the tunnel barrier pattern TBP in a process of forming the magnetic tunnel junction pattern MTJ, which will be described later. Thus, an electrical short between the first and second magnetic patterns MP1 and MP2 may be inhibited or prevented.

Each of the oxide layers 210 may include a metal oxide. In some embodiments, the oxide layer 210 may include the same metal element as the metal layer 220. For example, the metal layer 220 may include tantalum (Ta), titanium (Ti), magnesium (Mg), hafnium (Hf), zirconium (Zr), tungsten (W), molybdenum (Mo), and the like, while the oxide layer 210 may include tantalum oxide, titanium oxide, magnesium oxide, hafnium oxide, zirconium oxide, tungsten oxide, molybdenum oxide, and the like. In some embodiments, the oxide layer 210 may include substantially the same material as the tunnel barrier pattern TBP. In some embodiments, the metal layer 220 may include the same metal element as the tunnel barrier pattern TBP.

The oxide layer 210 and the tunnel barrier pattern TBP may have thicknesses in the first direction D1 perpendicular to the top surface 100u of the substrate 100. The thickness of each oxide layer 210 may be less than the thickness of the tunnel barrier pattern TBP. The thickness of the oxide layer 210 may preferably be 1 Å to 13 Å. As the thickness of the oxide layer 210 decreases, the conductive particle may be more easily combined with the element included in the oxide layer 210. Thus, conductive particles 300 generated in the process of forming the magnetic tunnel junction pattern MTJ may be easily re-deposited on a sidewall of the oxide layer 210 having the thickness less than that of the tunnel barrier pattern TBP. As a result, it is possible to inhibit the conductive particles 300 from being re-deposited on the sidewall of the tunnel barrier pattern TBP. Thus, an electrical short between the first and second magnetic patterns MP1 and MP2 may be prevented.

The metal layer 220 and the first and second magnetic patterns MP1 and MP2 may have thicknesses in the first direction D1. The thickness of each metal layer 220 may be less than each of the thicknesses of the first magnetic pattern MP1, the second magnetic pattern MP2, and the tunnel barrier pattern TBP.

The second electrode pattern 132 may be formed on the short preventing pattern 200. For example, the second electrode pattern 132 may include a metal (e.g., tungsten, aluminum, copper, titanium, ruthenium, and/or tantalum), a conductive metal nitride (e.g., titanium nitride, tantalum nitride, and/or tungsten nitride), or any combination thereof.

A second interlayer insulating layer 140 may be provided on the first electrode pattern 122, the first magnetic pattern MP1, the tunnel barrier pattern TBP, the second magnetic pattern MP2, the short preventing pattern 200, and the second electrode pattern 132. The second interlayer insulating layer 140 may include an insulating material. For example, the second interlayer insulating layer 140 may include a silicon oxide layer, a silicon nitride layer, a silicon oxynitride layer, and the like.

A second contact plug 145 may be provided in the second interlayer insulating layer 140. The second contact plug 145 may be electrically connected to the second electrode pattern 132. An interconnection line 150 may be provided on the second interlayer insulating layer 140. The interconnection line 150 may be electrically connected to the second contact plug 145. For example, each of the second contact plug 145 and the interconnection line 150 may include a doped semiconductor material (e.g., doped silicon), a metal (e.g., tungsten, aluminum, copper, titanium, and/or tantalum), a conductive metal nitride (e.g., titanium nitride, tantalum nitride, and/or tungsten nitride), a metal-semiconductor compound (e.g., a metal silicide), and the like.

According embodiments, the electrical short between the first and second magnetic patterns MP1 and MP2 may be prevented. Thus, electrical characteristics of the magnetic memory device may be improved.

Figure 7:
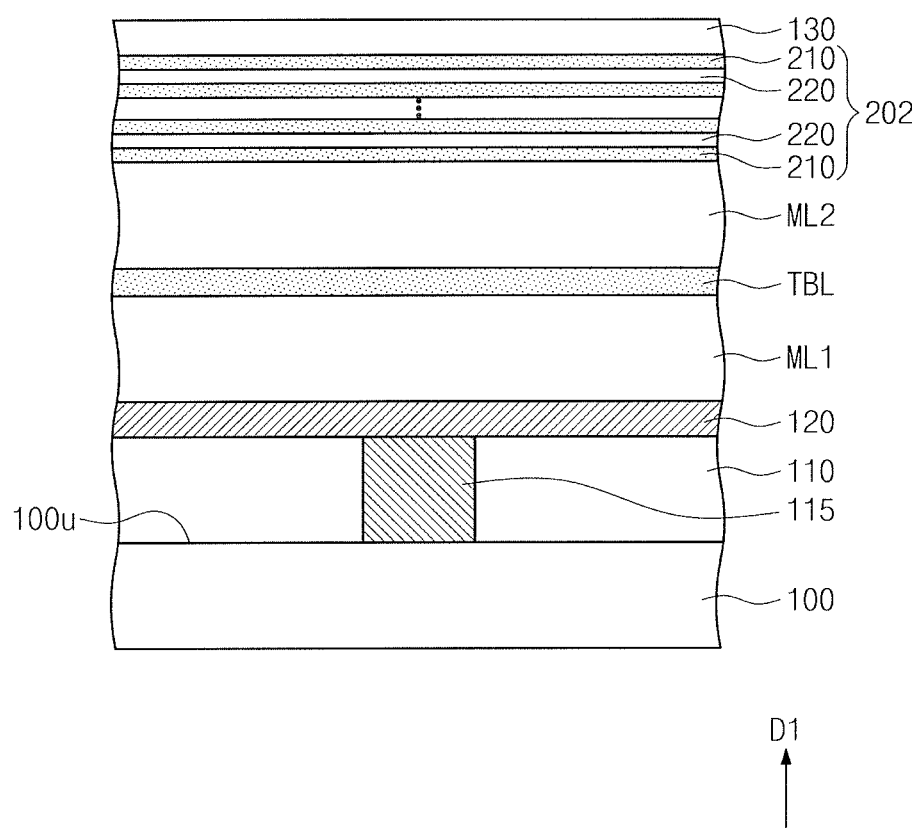
FIGS. 7 to 9 illustrate cross-sectional views of stages in a method for fabricating a magnetic memory device, according to some embodiments.
Figure 8:
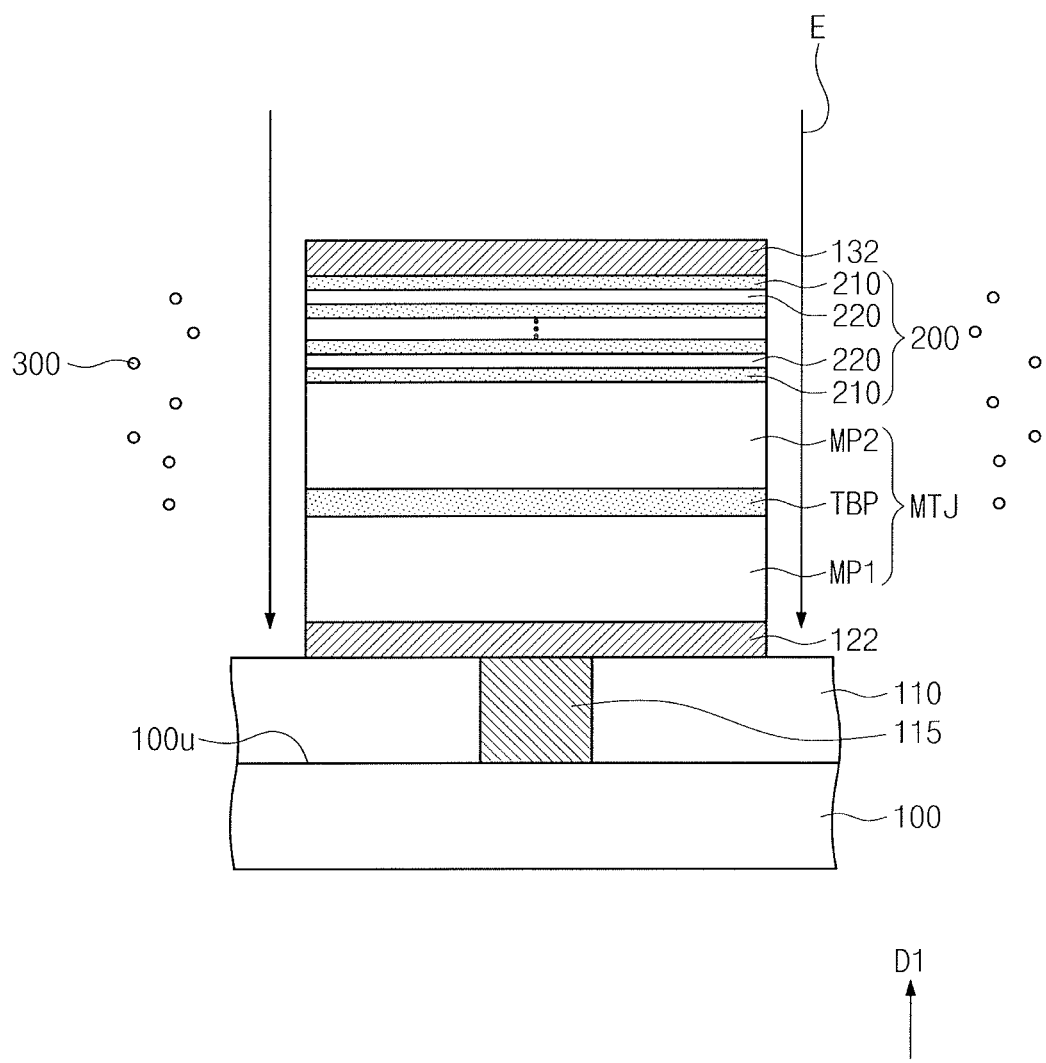
Figure 9:
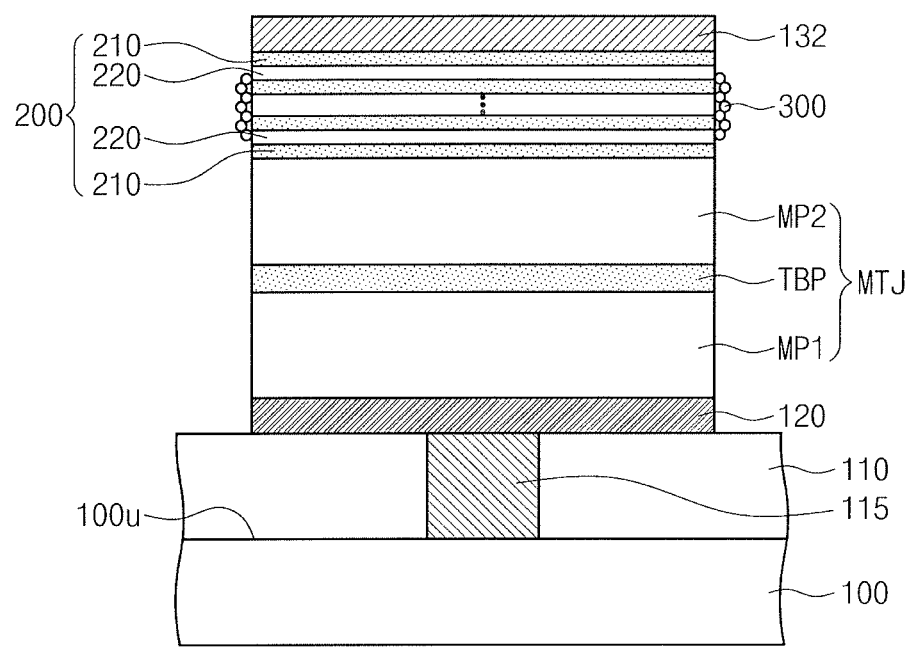

FIGS. 7 to 9 are cross-sectional views illustrating a method for fabricating a magnetic memory device, according to some embodiments.

Referring to FIG. 7, a substrate 100 may be provided. The substrate 100 may include a semiconductor material. For example, the substrate 100 may include a silicon substrate, a germanium substrate, or a silicon-germanium substrate. A selection element may be provided on the substrate 100. The selection element may be substantially the same as the selection element described with reference to FIG. 4.

A first interlayer insulating layer 110 may be formed on the substrate 100 to cover the selection element. The first interlayer insulating layer 110 may be formed by a physical vapor deposition (PVD) process, a chemical vapor deposition (CVD) process, an atomic layer deposition (ALD) process, and the like. For example, the first interlayer insulating layer 110 may include silicon oxide, silicon nitride, silicon oxynitride, and the like.

A first contact plug 115 may be formed in the first interlayer insulating layer 110. The formation of the first contact plug 115 may include forming a contact hole penetrating the first interlayer insulating layer 110, forming a conductive layer filling the contact hole, and planarizing the conductive layer until a top surface of the first interlayer insulating layer 110 is exposed. For example, the contact hole may be formed by anisotropically etching the first interlayer insulating layer 110 using an etch mask. The first contact plug 115 may include a conductive material. For example, the first contact plug 115 may include a doped semiconductor material (e.g., doped silicon), a metal (e.g., tungsten, aluminum, copper, titanium, and/or tantalum), a conductive metal nitride (e.g., titanium nitride, tantalum nitride, and/or tungsten nitride), a metal-semiconductor compound (e.g., a metal silicide), or any combination thereof.

A first electrode layer 120 may be formed on the first interlayer insulating layer 110 and the first contact plug 115. The first electrode layer 120 may be formed by a PVD process, a CVD process, an ALD process, or any combination thereof. For example, the first electrode layer 120 may include a metal, a conductive metal nitride, or a combination thereof. In some embodiments, the first electrode layer 120 may include at least one seed layer used as a seed in a process of forming a first magnetic layer ML1 to be described later. For example, when the first magnetic layer ML1 includes a magnetic material having a $L1_0$ structure, the first electrode layer 120 may include a conductive metal nitride having a sodium chloride (NaCl) crystal structure, e.g., titanium nitride, tantalum nitride, chromium nitride, vanadium nitride, and the like. For another example, when the first magnetic layer ML1 has a hexagonal close packed (HCP) crystal structure, the first electrode layer 120 may include a conductive material having the HCP crystal structure, e.g., ruthenium, titanium, and the like. Alternatively, the first electrode layer 120 may include still another conductive material, e.g., vanadium, tantalum, and the like.

The first magnetic layer ML1, a tunnel barrier layer TBL and a second magnetic layer ML2 may be sequentially formed on the first electrode layer 120. Each of the first magnetic layer ML1, the tunnel barrier layer TBL and the second magnetic layer ML2 may be formed by a PVD process, a CVD process, an ALD process, or any combination thereof.

In some embodiments, the first magnetic layer ML1 may be a reference magnetic layer having a perpendicular magnetization. In this case, the first magnetic layer ML1 may include at least one of a perpendicular magnetic material, a perpendicular magnetic material having the $L1_0$ structure, a CoPt alloy having a hexagonal close packed (HCP) lattice structure, or a perpendicular magnetic structure. The perpendicular magnetic material may include at least one of, for example, CoFeTb, CoFeGd, or CoFeDy. The perpendicular magnetic material having the $L1_0$ structure may include at least one of, for example, FePt having the $L1_0$ structure, FePd having the $L1_0$ structure, CoPd having the $L1_0$ structure, or CoPt having the $L1_0$ structure. The perpendicular magnetic structure may include magnetic layers and non-magnetic layers, which are alternately and repeatedly stacked. For example, the perpendicular magnetic structure may include at least one of a (Co/Pt)n stack structure, a (CoFe/Pt)n stack structure, a (CoFe/Pd)n stack structure, a (Co/Pd)n stack structure, a (Co/Ni)n stack structure, a (CoNi/Pt)n stack structure, a (CoCr/Pt)n stack structure, or a (CoCr/Pd)n stack structure, where "n" denotes the number of bilayers.

Alternatively, the first magnetic layer ML1 may be a reference magnetic layer having a horizontal magnetization.

The tunnel barrier layer TBL may include at least one of magnesium oxide, titanium oxide, aluminum oxide, magnesium-zinc oxide, or magnesium-boron oxide. In some embodiments, the tunnel barrier layer TBL may include magnesium oxide having the sodium chloride (NaCl) crystal structure.

In some embodiments, the second magnetic layer ML2 may be a free magnetic layer having a perpendicular magnetization. For example, the second magnetic layer ML2 may include a magnetic element (e.g., iron (Fe)) which is combined with oxygen to induce interface perpendicular magnetic anisotropy (iPMA). In addition, the second magnetic layer may further include boron (B). For example, the second magnetic layer ML2 may be formed of cobalt-iron-born (CoFeB). In some embodiments, the second magnetic layer ML2 may be in an amorphous state. Alternatively, the second magnetic layer ML2 may include at least one of the perpendicular magnetic material (e.g., CoFeTb, CoFeGd, or CoFeDy), the perpendicular magnetic material having the $L1_0$ structure, the CoPt alloy having the HCP lattice structure, or the perpendicular magnetic structure.

Alternatively, the second magnetic layer ML2 may be a free magnetic layer having a horizontal magnetization.

A short preventing layer 202 may be formed on the second magnetic layer ML2. The formation of the short preventing layer 202 may include a process of alternately and repeatedly depositing oxide layers 210 and the metal layers 220 on the second magnetic layer ML2. For example, the deposition process may include a PVD process, a CVD process, an ALD process, or any combination thereof. In some embodiments, a lowermost one of the oxide layers 210 may be in contact, e.g., direct contact, with the second magnetic layer ML2. In this case, each of the metal layers 220 may be between a pair of the oxide layers 210 adjacent directly to each other. In certain embodiments, a lowermost one of the metal layers 220 may be in contact, e.g., direct contact with the second magnetic layer ML2. In this case, each of the oxide layers 210 may be between a pair of the metal layers 220 adjacent directly to each other. In other words, in either embodiment, a position of an uppermost layer of the second magnetic layer ML2 and a position of a lowermost layer of the short preventing layer 202 are the same.

Each of the oxide layers 210 may include a metal oxide. In some embodiments, the oxide layer 210 may include a metal oxide including the same metal element as the metal layer 220. For example, the metal layer 220 may include tantalum (Ta), titanium (Ti), magnesium (Mg), hafnium (Hf), zirconium (Zr), tungsten (W), molybdenum (Mo), while the oxide layer 210 may include tantalum oxide, titanium oxide, magnesium oxide, hafnium oxide, zirconium oxide, tungsten oxide, molybdenum oxide. A thickness of each oxide layer 210 may be less than a thickness of the tunnel barrier layer TBL. A thickness of each metal layer 220 may be less than thicknesses of the first magnetic layer ML1, the second magnetic layer ML2, and the tunnel barrier layer TBL.

A second electrode layer 130 may be formed on the short preventing layer 202. The second electrode layer 130 may be formed using a PVD process, a CVD process, an ALD process, or any combination thereof. For example, the second electrode layer 130 may include a metal (e.g., tungsten, aluminum, copper, titanium, ruthenium, and/or tantalum), a conductive metal nitride (e.g., titanium nitride, tantalum nitride, and/or tungsten nitride), or any combination thereof.

Referring to FIG. 8, the second electrode layer 130, the short preventing layer 202, the second magnetic layer ML2, the tunnel barrier layer TBL, the first magnetic layer ML1, and the first electrode layer 120 may be sequentially etched. In some embodiments, the etching process may be an ion beam etching process. The second electrode pattern 132, the short preventing pattern 200, the second magnetic pattern MP2, the tunnel barrier pattern TBP, the first magnetic pattern MP1, and the first electrode pattern 122 may be formed by the etching process. The first and second magnetic patterns MP1 and MP2, and the tunnel barrier pattern TBP therebetween, may constitute a magnetic tunnel junction pattern MTJ.

Inert gas ions (e.g., argon ions (Ar$^+$)) may be used as an ion source during the etching process. In this case, the short preventing pattern 200 may be charged with electricity by the ion source in the etching process. Thus, the short preventing pattern 200 may form an electric field. The short preventing pattern 200 may have a capacitance greater than that of the tunnel barrier pattern TBP. This may be due to a multi-layered structure of the short preventing pattern 200 including alternating oxide layers 210 and metal layers 220. In this case, an amount of charge in the short preventing pattern 200 may be greater than an amount of charge in the tunnel barrier pattern TBP. Thus, when both the short preventing pattern 200 and the tunnel barrier pattern TBP are charged with electricity, an intensity of the electric field formed by the short preventing pattern 200 may be greater than an intensity of an electric field formed by the tunnel barrier pattern TBP.

Conductive particles 300 formed of materials of the first and second magnetic patterns MP1 and MP2, and the first and second electrode patterns 122 and 132 may be generated as etching by-products by the etching process. The conductive particles 300 may include the same element(s) as at least one or more of elements included in the first and second magnetic patterns MP1 and MP2, and the first and second electrode patterns 122 and 132. For example, the conductive particles 300 may include at least one of copper (Cu), aluminum (Al), ruthenium (Ru), tantalum (Ta), titanium (Ti), magnesium (Mg), hafnium (Hf), zirconium (Zr), tungsten (W), molybdenum (Mo), and the like.

The first electrode pattern 122 may be electrically connected to the first contact plug 115 formed in the first interlayer insulating layer 110. The magnetic tunnel junction pattern MTJ may be formed between the first electrode pattern 122 and the second electrode pattern 132.

Referring to FIG. 9, the conductive particles 300 may be re-deposited on a sidewall of the short preventing pattern 200. The thickness of the oxide layer 210 may preferably be 1 Å to 13 Å. Stabilization energy of the conductive particles 300 with respect to the oxide layer 210 may increase as the thickness of the oxide layer 210 decreases. Thus, the conductive particles 300 may be more easily combined with the oxide layer 210 of the short preventing pattern 200 than with the tunnel barrier pattern TBP. The stabilization energy of the conductive particles 300 with respect to the oxide layer 210 of the structure in which the oxide layers 210 and the metal layers 220 are alternately stacked may be higher than the stabilization energy of the conductive particles 300 with respect to an oxide layer provided alone. Thus, the conductive particles 300 may be more easily combined with the oxide layer 210 of the short preventing pattern 200 than with the oxide layer provided alone. As a result, the conductive particles 300 may be mainly re-deposited on the sidewall of the short preventing pattern 200.

At least some of the conductive particles 300 may move to the short preventing pattern 200 by the electric field formed by the short preventing pattern 200. Since the intensity of the electric field formed by the short preventing pattern 200 is greater than the intensity of the electric field formed by the tunnel barrier pattern TBP, the conductive particles 300 may be more easily combined with (or re-deposited on) the sidewall of the short preventing pattern 200 than with the tunnel barrier pattern TBP, during the etching process. As a result, the conductive particles 300 may be mainly re-deposited on the sidewall of the short preventing pattern 200.

Generally, conductive particles may be re-deposited on a sidewall of a tunnel barrier pattern, which may electrically short first and second magnetic patterns. However, according to some embodiments, the conductive particles 300 may be more easily re-deposited on the sidewall of the short preventing pattern 200 than on a sidewall of the tunnel barrier pattern TBP. As a result, the conductive particles 300 may be inhibited or prevented from being re-deposited on the sidewall of the tunnel barrier pattern TBP. Thus the first and second magnetic patterns MP1 and MP2 may be electrically isolated each other.

Referring again to FIG. 4, the second interlayer insulating layer 140 may be formed on the first interlayer insulating layer 110 to cover the first electrode pattern 122, the first magnetic pattern MP1, the tunnel barrier pattern TBP, the second magnetic pattern MP2, the short preventing pattern 200, and the second electrode pattern 132. The second interlayer insulating layer 140 may be formed by a PVD process, a CVD process, an ALD process, and the like. For example, the second interlayer insulating layer 140 may include silicon oxide, silicon nitride, silicon oxynitride, and the like.

A second contact plug 145 may be formed in the second interlayer insulating layer 140. The second contact plug 145 may penetrate the second interlayer insulating layer 140 so as to be electrically connected to the second electrode pattern 132. The formation of the second contact plug 145 may include forming a contact hole penetrating the second interlayer insulating layer 140, forming a conductive layer filling the contact hole, and planarizing the conductive layer until a top surface of the second interlayer insulating layer 140 is exposed. For example, the contact hole may be formed by anisotropically etching the second interlayer insulating layer 140 using an etch mask. The second contact plug 145 may include a conductive material. For example, the second contact plug 145 may include a doped semiconductor material (e.g., doped silicon), a metal (e.g., tungsten, aluminum, copper, titanium, and/or tantalum), a conductive metal nitride (e.g., titanium nitride, tantalum nitride, and/or tungsten nitride), a metal-semiconductor compound (e.g., a metal silicide), or any combination thereof.

An interconnection line 150 may be formed on the second interlayer insulating layer 140. The interconnection line 150 may be electrically connected to the second contact plug 145. For example, the interconnection line 150 may include a doped semiconductor material (e.g., doped silicon), a metal (e.g., tungsten, aluminum, copper, titanium, and/or tantalum), a conductive metal nitride (e.g., titanium nitride, tantalum nitride, and/or tungsten nitride), a metal-semiconductor compound (e.g., a metal silicide), or any combination thereof. In some embodiments, the interconnection line 150 may be a bit line.

According to embodiments, efficiency of processes for fabricating the magnetic memory device may be improved and the reliability of the magnetic memory device may be improved.

Figure 10:
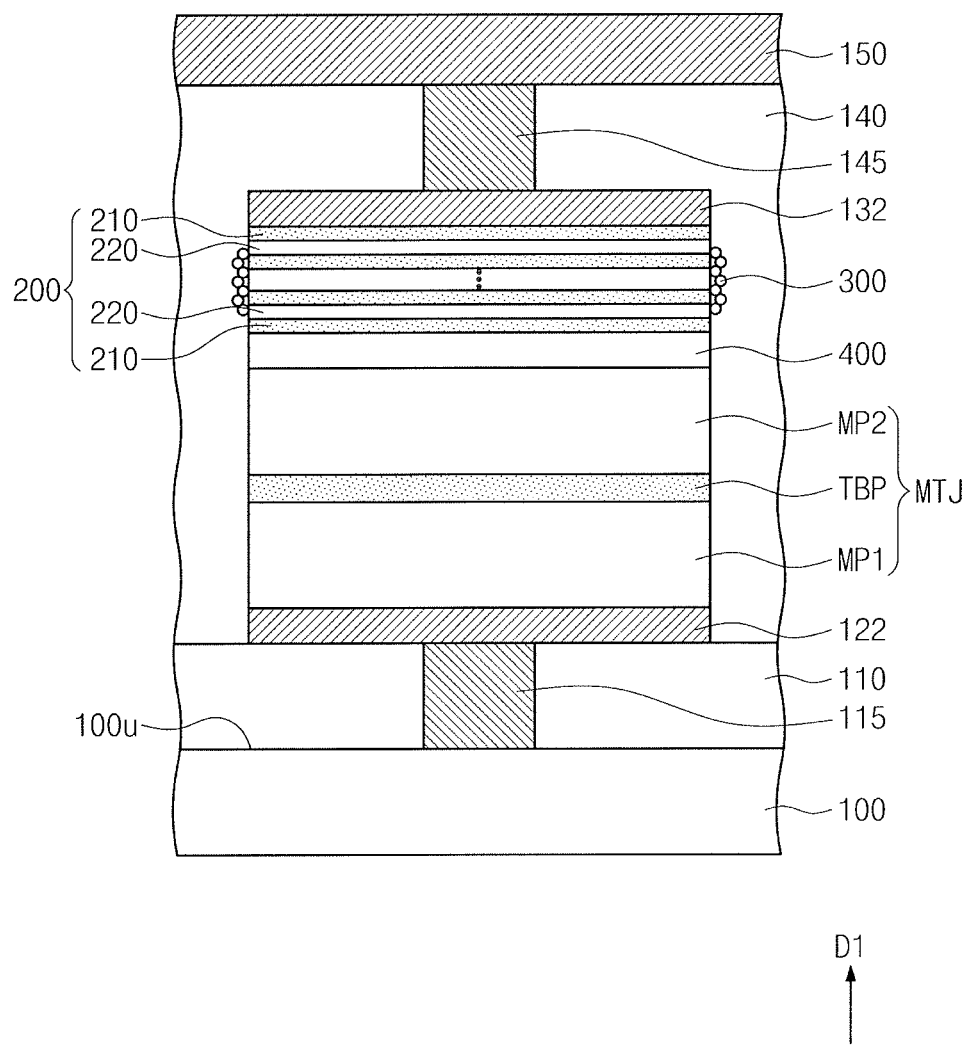
FIG. 10 illustrates a cross-sectional view of a magnetic memory device according to some embodiments.

FIG. 10 is a cross-sectional view illustrating a magnetic memory device according to some embodiments. In the present embodiment, the descriptions to the same components and technical features as in the embodiments of FIG. 4 will be omitted or mentioned briefly for the purpose of ease and convenience in explanation.

Referring to FIG. 10, a non-magnetic pattern 400 may be provided between the short preventing pattern 200 and the second magnetic pattern MP2. The non-magnetic pattern 400 may include an oxide. For example, the non-magnetic pattern 400 may include tantalum oxide, titanium oxide, magnesium oxide, hafnium oxide, zirconium oxide, tungsten oxide, molybdenum oxide, and the like. The non-magnetic pattern 400 may enhance the perpendicular magnetic anisotropy of the second magnetic pattern MP2. Thus, magnetic characteristics of a magnetic memory device may be improved.

The short preventing pattern 200 according to embodiments may inhibit or prevent the conductive particles 300 from being re-deposited on the sidewall of the tunnel barrier pattern TBP. Thus, electrical characteristics of the magnetic memory device may be improved.

Figure 11:
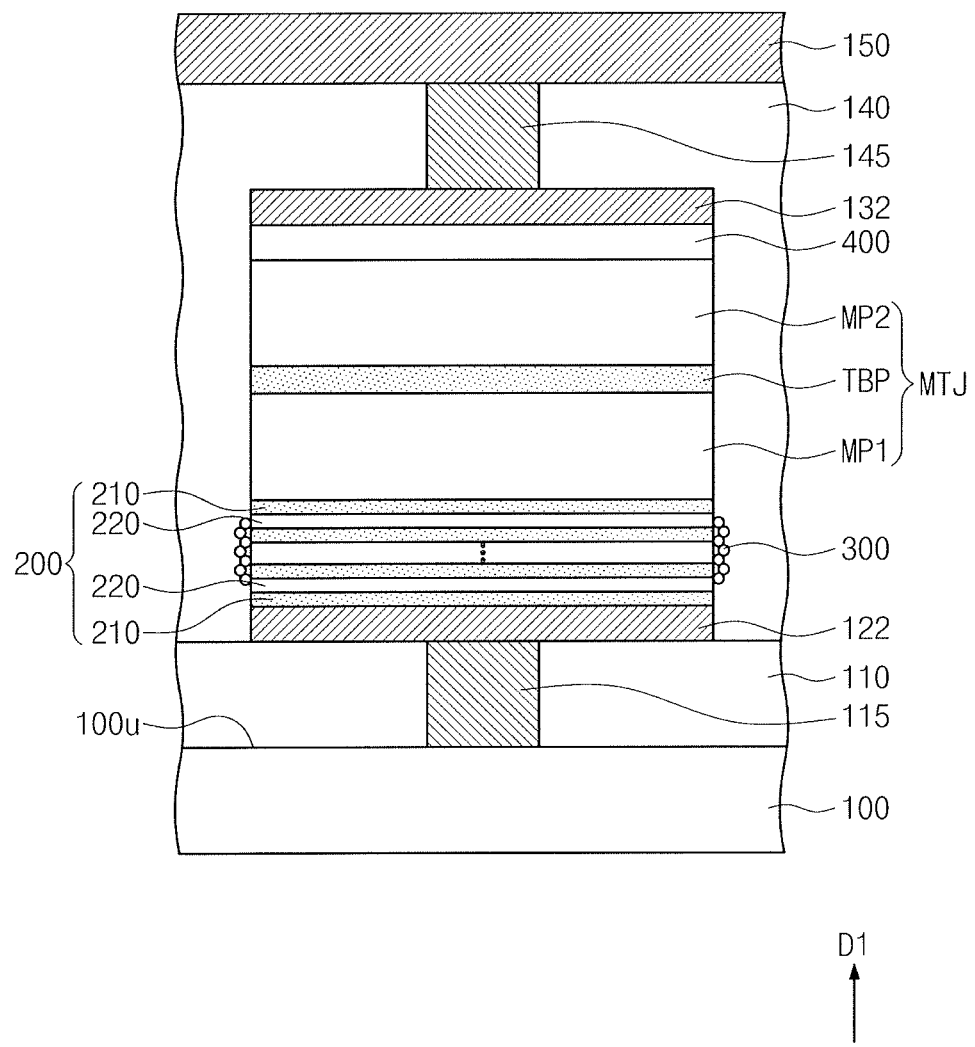
FIG. 11 illustrates a cross-sectional view of a magnetic memory device according to some embodiments.

FIG. 11 is a cross-sectional view illustrating a magnetic memory device according to some embodiments. In the present embodiment, the descriptions to the same components and technical features as in the embodiments of FIGS. 4 and 10 will be omitted or mentioned briefly for the purpose of ease and convenience in explanation.

Referring to FIG. 11, the short preventing pattern 200 may be between the first magnetic pattern MP1 and the first electrode pattern 122. Except for the position of the short preventing pattern 200, other features of the short preventing pattern 200 may be substantially the same as corresponding features of the short preventing pattern 200 described with reference to FIG. 4.

The non-magnetic pattern 400 may be provided between the second magnetic pattern MP2 and the second electrode pattern 132. The non-magnetic pattern 400 may be substantially the same as the non-magnetic pattern 400 described with reference to FIG. 10.

The short preventing pattern 200 according to embodiments may inhibit or prevent the conductive particles 300 from being re-deposited on the sidewall of the tunnel barrier pattern TBP, and thus electrical characteristics of the magnetic memory device may be improved.

Figure 12:
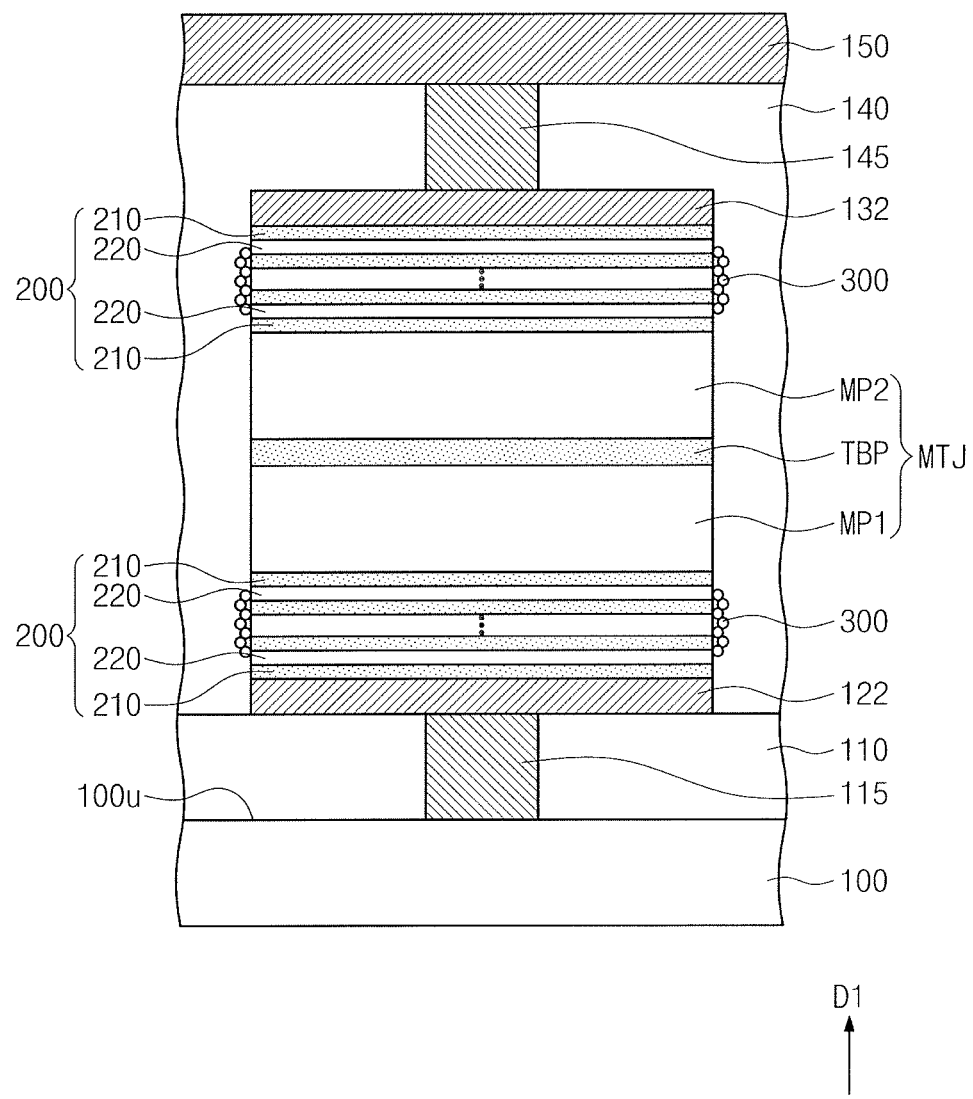
FIG. 12 illustrates a cross-sectional view of a magnetic memory device according to some embodiments.

FIG. 12 is a cross-sectional view illustrating a magnetic memory device according to some embodiments. In the present embodiment, the descriptions to the same components and technical features as in the embodiments of FIG. 4 will be omitted or mentioned briefly for the purpose of ease and convenience in explanation.

Referring to FIG. 12, a pair of short preventing patterns 200 may be provided. The pair of short preventing patterns 200 may be between the first electrode pattern 122 and the first magnetic pattern MP1, and between the second magnetic pattern MP2 and the second electrode pattern 132, respectively. The conductive particles 300 may be re-deposited on sidewalls of the pair of short preventing patterns 200.

The short preventing pattern 200 according to embodiments may inhibit or prevent the conductive particles 300 from being re-deposited on the sidewall of the tunnel barrier pattern TBP, and thus electrical characteristics of the magnetic memory device may be improved.

Figure 13:
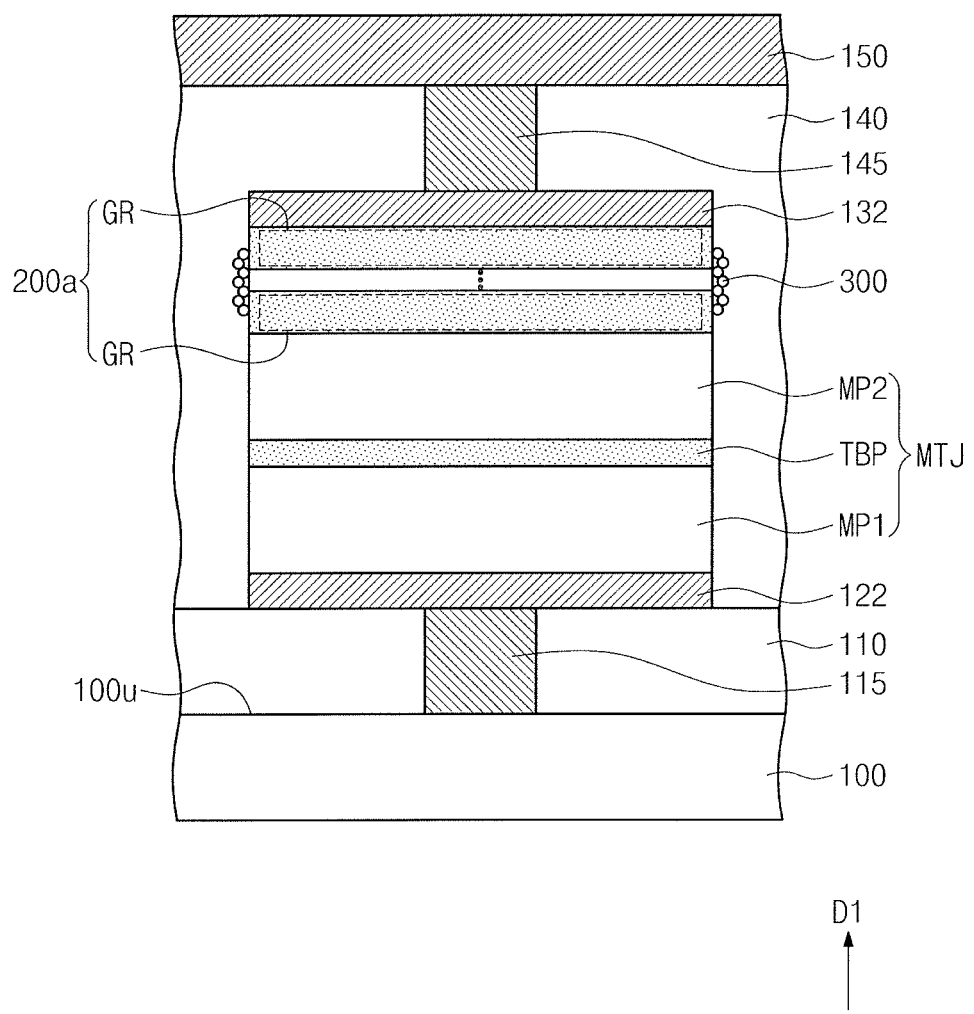
FIG. 13 illustrates a cross-sectional view of a magnetic memory device according to some embodiments.

FIG. 13 is a cross-sectional view illustrating a magnetic memory device according to some embodiments. In the present embodiment, the descriptions to the same components and technical features as in the embodiments of FIG. 4 will be omitted or mentioned briefly for the purpose of ease and convenience in explanation.

Referring to FIG. 13, a short preventing pattern 200a may include gradient regions GR. The gradient regions GR may include an oxide. Oxygen atoms in each of the gradient regions GR may have a concentration gradient in the first direction D1 perpendicular to the top surface 100u of the substrate 100. In some embodiments, a concentration of the oxygen atoms may be lowest at a central portion of each of the gradient regions GR and may become higher toward each of a top surface and a bottom surface of each of the gradient regions GR in the first direction D1.

The short preventing pattern 200a including the gradient regions GR may be easily combined with the conductive particles 300, like the short preventing pattern 200 (see FIG. 4) including the oxide layers 210 and the metal layers 220, which are alternately stacked. Thus, in the process of forming the magnetic tunnel junction pattern MTJ, the conductive particles 300 may be easily combined with a sidewall of the short preventing pattern 200 to prevent an electrical short between the first and second magnetic patterns MP1 and MP2.

The short preventing pattern 200 according to embodiments may inhibit or prevent the conductive particles 300 from being re-deposited on the sidewall of the tunnel barrier pattern TBP, and thus electrical characteristics of the magnetic memory device may be improved.

Figure 14:
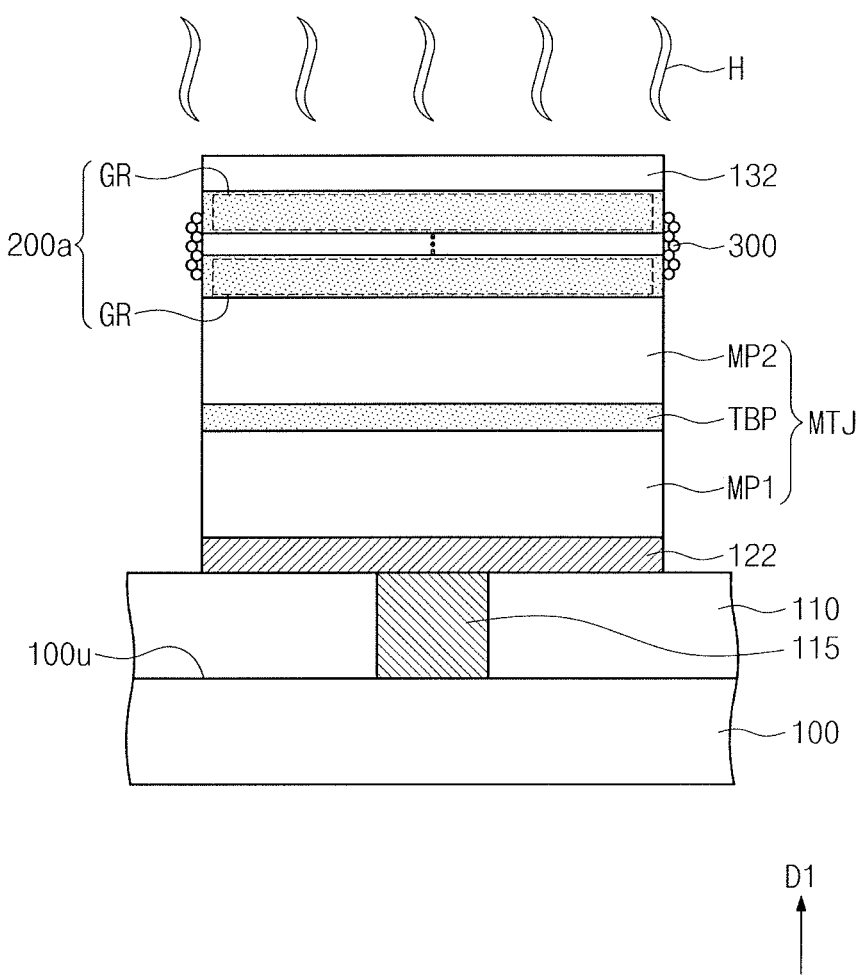
FIG. 14 illustrates a cross-sectional view of a stage in method for fabricating a magnetic memory device, according to some embodiments.

FIG. 14 is a cross-sectional view illustrating a method for fabricating a magnetic memory device, according to some embodiments. Referring to FIG. 14, substantially the same processes as described with reference to FIGS. 7 to 9 may be performed to form the first interlayer insulating layer 110, the first contact plug 115, the first electrode pattern 122, the first magnetic pattern MP1, the tunnel barrier pattern TBP, the second magnetic pattern MP2, the short preventing pattern 200 and the second electrode pattern 132 on the substrate 100. The short preventing pattern 200 may include the oxide layers 210 and the metal layers 220, which are alternately stacked.

A thermal treatment process H may be performed on the first interlayer insulating layer 110, the first contact plug 115, the first electrode pattern 122, the first magnetic pattern MP1, the tunnel barrier pattern TBP, the second magnetic pattern MP2, the short preventing pattern 200, and the second electrode pattern 132.

Referring again to FIG. 14, oxygen atoms in the oxide layers 210 may be diffused into the metal layers 220 by performing the thermal treatment process H. Thus, gradient regions GR may be formed in the short preventing pattern 200, such that the short preventing pattern 200a may be formed. Oxygen atoms in each of the gradient regions GR may have a concentration gradient in the first direction D1 perpendicular to the top surface 100u of the substrate 100. In some embodiments, a concentration of the oxygen atoms may be lowest at a central portion of each of the gradient regions GR and may become higher toward each of a top surface and a bottom surface of each of the gradient regions GR in the first direction D1. In some embodiments, the thermal treatment process H may be performed a plurality of times.

The short preventing pattern according to embodiments may inhibit or prevent the conductive particles from being re-deposited on the sidewall of the tunnel barrier pattern. Thus, electrical characteristics of the magnetic memory device may be improved.

According to some embodiments, the electrical characteristics and the reliability of the magnetic memory device may be improved. According to some embodiments, a method for fabricating the magnetic memory device with the improved electrical characteristics and reliability is provided.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated.

Accordingly, it will be understood by those of skill in the art that various changes in form and details may be made without departing from the spirit and scope of the present invention as set forth in the following claims.

What is claimed is:

1. A magnetic memory device, comprising:
a substrate;
a tunnel barrier pattern on the substrate;
a first magnetic pattern and a second magnetic pattern spaced apart from each other with the tunnel barrier pattern therebetween;
a short preventing pattern spaced apart from the tunnel barrier pattern with the second magnetic pattern therebetween; and
conductive particles on a sidewall of the short preventing pattern,
wherein the short preventing pattern includes at least two oxide layers and at least two metal layers, which are alternately stacked.

2. The magnetic memory device as claimed in claim 1, wherein each of the at least two oxide layers includes a metal oxide.

3. The magnetic memory device as claimed in claim 2, wherein a metal element in the metal oxide is the same as a metal element in the at least two metal layers.

4. The magnetic memory device as claimed in claim 1, wherein a thickness of each of the at least two oxide layers is less than a thickness of the tunnel barrier pattern.

5. The magnetic memory device as claimed in claim 1, wherein a thickness of each of the at least two metal layers is less than a thickness of the first magnetic pattern and a thickness of the second magnetic pattern.

6. The magnetic memory device as claimed in claim 1, wherein the tunnel barrier pattern and the at least two oxide layers include the same material.

7. The magnetic memory device as claimed in claim 1, wherein the tunnel barrier pattern and the at least two metal layers include the same metal element.

8. The magnetic memory device as claimed in claim 1, wherein the conductive particles include the same element as the first and second magnetic patterns.

9. The magnetic memory device as claimed in claim 1, further comprising:
a non-magnetic pattern between the short preventing pattern and the second magnetic pattern, wherein the non-magnetic pattern includes an oxide.

10. The magnetic memory device as claimed in claim 1, wherein the second magnetic pattern is between the tunnel barrier pattern and the substrate.

11. The magnetic memory device as claimed in claim 1, further comprising:
an additional short preventing pattern spaced apart from the tunnel barrier pattern with the first magnetic pattern therebetween.

12. The magnetic memory device as claimed in claim 1, wherein:
the first magnetic pattern is between the tunnel barrier pattern and the substrate, and
a lowermost one of the at least two oxide layers in the short preventing pattern is in direct contact with a top surface of the second magnetic pattern.

13. A magnetic memory device, comprising:
a substrate;
a tunnel barrier pattern on the substrate;
a first magnetic pattern and a second magnetic pattern spaced apart from each other with the tunnel barrier pattern therebetween;
a short preventing pattern spaced apart from the tunnel barrier pattern with the second magnetic pattern therebetween; and
conductive particles on a sidewall of the short preventing pattern,
wherein the short preventing pattern includes an oxide layer, and
wherein oxygen atoms in the oxide layer have a concentration gradient in a direction perpendicular to a top surface of the substrate.

14. The magnetic memory device as claimed in claim 13, wherein a concentration of the oxygen atoms is lowest at a central portion of the oxide layer and becomes higher toward each of a top surface and a bottom surface of the oxide layer.

15. The magnetic memory device as claimed in claim 13, wherein:
the oxide layer includes a plurality of oxide layers, and
the plurality of oxide layers are stacked in the direction perpendicular to the top surface of the substrate.

* * * * *